United States Patent [19]
Yasuda et al.

[11] Patent Number: 5,317,641
[45] Date of Patent: May 31, 1994

[54] FADER DEPTH CONTROL APPARATUS

[75] Inventors: Fujio Yasuda, Coral Springs; Alan Flum, Ft. Lauderdale, both of Fla.

[73] Assignee: Sony Electronics Inc., N.J.

[21] Appl. No.: 683,887

[22] Filed: Apr. 11, 1991

[51] Int. Cl.⁵ .................... H04B 1/00; H03G 3/00
[52] U.S. Cl. ........................... 381/119; 381/109; 381/104
[58] Field of Search ............ 381/104, 105, 107, 109, 381/119, 381

[56] References Cited

U.S. PATENT DOCUMENTS

| | | |
|---|---|---|
| 2,247,554 | 7/1941 | Garity et al. |
| 3,882,275 | 5/1975 | Carroll |
| 4,070,698 | 1/1978 | Curtis et al. |
| 4,101,840 | 7/1978 | Fricke et al. ............ 381/104 |
| 4,187,544 | 2/1980 | Larner |
| 4,306,114 | 12/1981 | Callahan ............ 381/119 |
| 4,320,255 | 3/1982 | Null et al. ............ 381/109 |
| 4,677,674 | 6/1987 | Snyder |
| 4,885,792 | 12/1989 | Christensen et al. |

FOREIGN PATENT DOCUMENTS 58-50682  3/1983  Japan.

*Primary Examiner*—James L. Dwyer
*Assistant Examiner*—Jack Chiang
*Attorney, Agent, or Firm*—Ronald P. Kananen

[57] ABSTRACT

The present invention is directed to an audio mixing console having main and secondary faders to independently adjust the maximum and minimum levels of a FADE OUT or FADE IN signal received from an editor associated with the mixer console.

5 Claims, 4 Drawing Sheets

FADER DEPTH CONTROL APPARATUS

FIELD OF THE INVENTION

The present invention relates generally to audio mixers and, more specifically, to setting fader levels in an audio mixer.

BACKGROUND OF THE INVENTION

In the prior art, it is known to use FADE OUT or FADE IN signals (collectively referred to as a FADE signal) in order to execute a fading out of a particular audio signal or the fading in of such a signal. FIG. 1 depicts the general shape of such signals. It is also known that FADE signals can be generated by an editor used in conjunction with an audio mixer.

However, when an editor is used to generate a FADE signal, typically a fade can be implemented only to either the minimum or maximum level of the FADE signal such as shown in FIG. 1. In order to overcome this drawback, it is known to provide one or more faders on the audio mixing console in order to adjust the maximum and/or minimum level of the FADE signal. For example, as shown in FIG. 2, a main fader may be used to lower the maximum FADE level or FADE IN point. A secondary fader can be used to adjust the minimum fade level or FADE OUT point thereby providing a depth of fade control.

However, in some circumstances a drawback exists with this two control scheme. That is, the two controls are interactive. This occurs on the Soundcraft 200 BVE and the Sony MXP-2900, for example. To further explain, the "interactive" nature of these controls means that when the main fader is adjusted to change the maximum fade level, the minimum fade level is also adjusted even if the secondary fader is not adjusted. This may occur if, for example, the minimum level is determined to be some ratio of the maximum level. This occurs in the Soundcraft 200 BVE, for example, because the main fader is located in the audio path. Therefore, if the main fader is adjusted, the level of attenuation due to the secondary fader is also effected. In effect, the main fader shifts the entire FADE signal curve. To illustrate this, reference is made to FIGS. 3A-3B.

From FIGS. 3A-3B, it can be seen that if, for example, the main fader is set at a position corresponding to a maximum value (MAX) and the secondary fader is set at point A (an arbitrary reference point), then the FADE signal will resemble that shown by solid lines in FIG. 3A. If the main fader is adjusted as shown in FIG. 3B, and the secondary fader is not adjusted (it remains at reference point A), then the FADE signal will resemble that shown by the solid lines in FIG. 3B. In other words, adjusting the main fader downwards causes a downward shift of the entire signal including the FADE OUT level. This can be undesirable in that it may necessitate adjusting the secondary fader, if, for example, an absolute FADE OUT level is desired. That is, if it is desired that the FADE OUT level not be a ratio of the main fader or maximum level.

While a FADE OUT signal is shown in FIGS. 2-3, it will be readily apparent to one of ordinary skill in the art that the same phenomena will occur with a FADE IN signal such as shown in FIG. 1. To avoid unnecessary duplication and for clarity, the following will discuss either a FADE OUT signal or generally a FADE signal. It is to be understood that the invention clearly applies to both FADE IN and FADE OUT signals.

SUMMARY OF THE INVENTION

It is an object of the present invention to overcome these and other drawbacks of the prior art.

It is a further object of the invention to enable the minimum and maximum levels of a FADE signal to be adjusted independently.

In order to accomplish these and other objects of the present invention, there is provided novel circuitry which enables the minimum and maximum FADE levels to be separately and independently set.

More specifically, according to one embodiment of the present invention there is provided a control circuit which supplies fader control signals to a VCA associated with a particular channel of an audio mixer so that audio signal fading can be accomplished by independently adjusting a main fade level and a secondary fade level. According to a preferred embodiment, the main fader and secondary fader are not in the audio signal path. Additionally, analog circuitry, which functions essentially similar to an OR gate is used to compare a main fader signal with a secondary fader signal and supplies the larger of the two signals to the VCA associated with the channel as a voltage control signal to effect a desired audio signal attenuation.

DETAILED DESCRIPTION OF THE PREFERRED EMBODIMENT

Figure 3A:
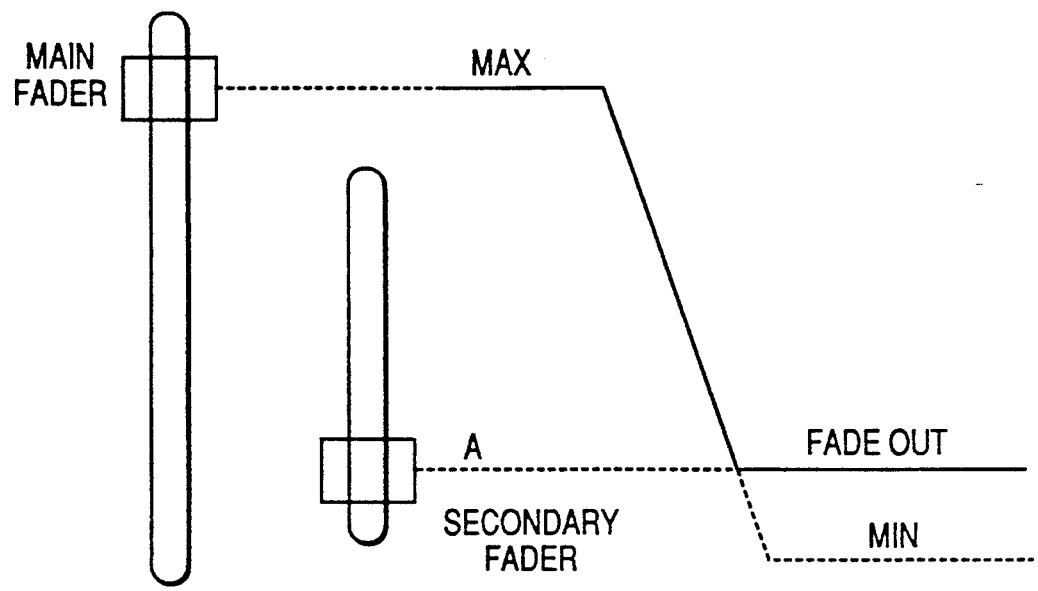
FIGS. 3A-3B illustrate the effects on a FADE OUT signal of a prior art type mixer when a main fader level is adjusted and a secondary fader level remains fixed.
Figure 3B:
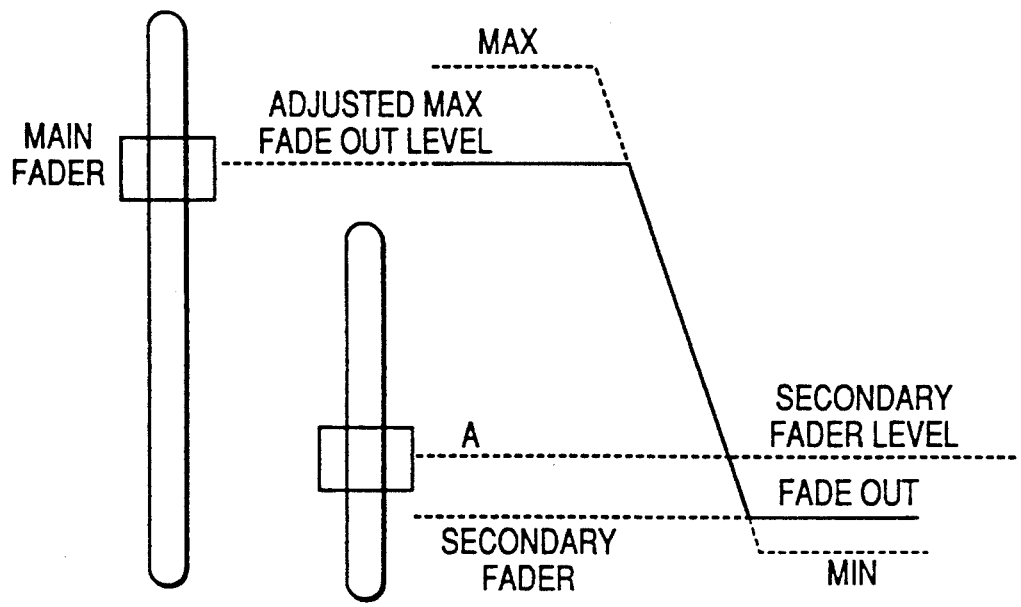
Figure 4A:
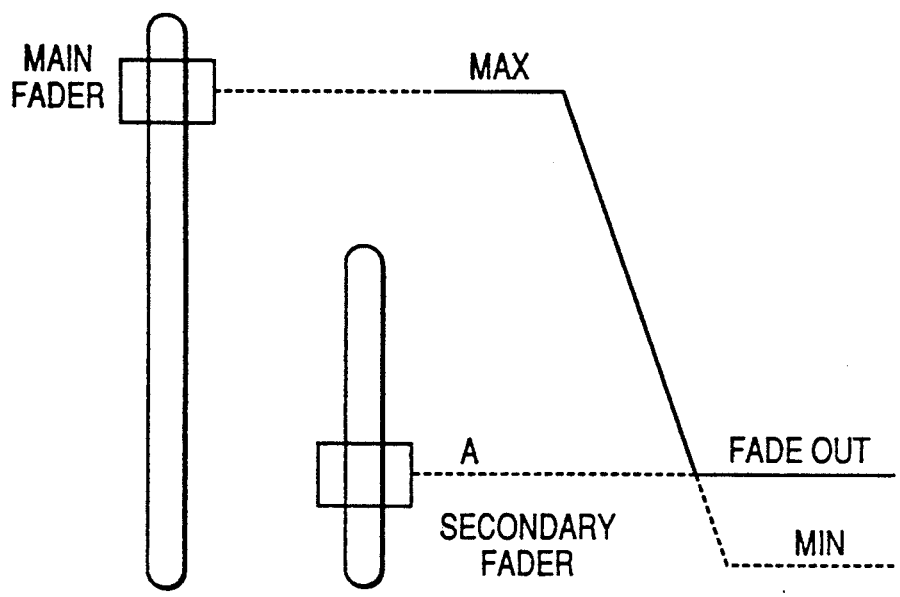
FIGS. 4A-4B illustrate the effects of the adjustment of a main fader according to an apparatus of the present invention where the secondary fader level remains fixed.
Figure 4B:
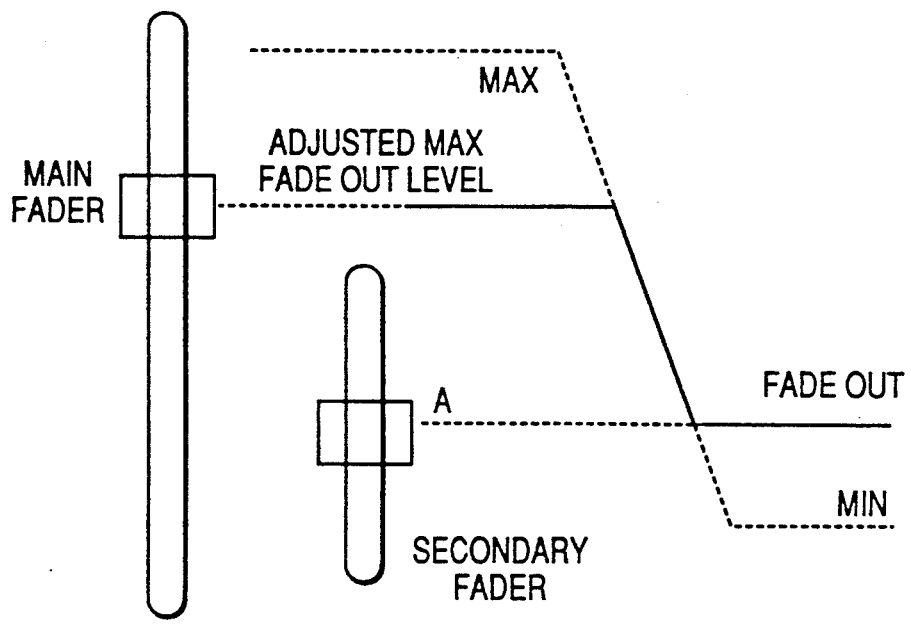

With reference to FIGS. 4A-4B, a description of one embodiment of the present invention will be described. As shown there, if a main fader, associated with an audio mixing console (not shown), is at a position corresponding to a maximum value, for example, and a secondary fader is at an arbitrary reference point A, for example, the FADE OUT signal supplied to a VCA will resemble that shown by solid lines in FIG. 4A. If the main fader level is adjusted such that it is lowered to an adjusted maximum FADE OUT level, for example, the FADE OUT signal will resemble that shown by solid lines in FIG. 4B. Note, contrary to the operation of the prior art (e.g., FIG. 3B), the minimum level of the FADE OUT signal is not affected by adjustment of the main fader. This is due, in part, according to one embodiment of the present invention to the fact that a comparison of signals is made to determine the larger of the two signals. This feature is described in more detail, below with respect to FIG. 5. This is advantageous, for example, when it is desired to set a predetermined or absolute minimum level that is fixed independently of the maximum level. This overcomes one drawback of the prior art wherein the minimum level is a ratio of the maximum level, or dependent on the main fader setting.

Similarly, movement of the secondary fader will not affect the maximum level. Therefore, the maximum and minimum levels are set independently.

Figure 5:
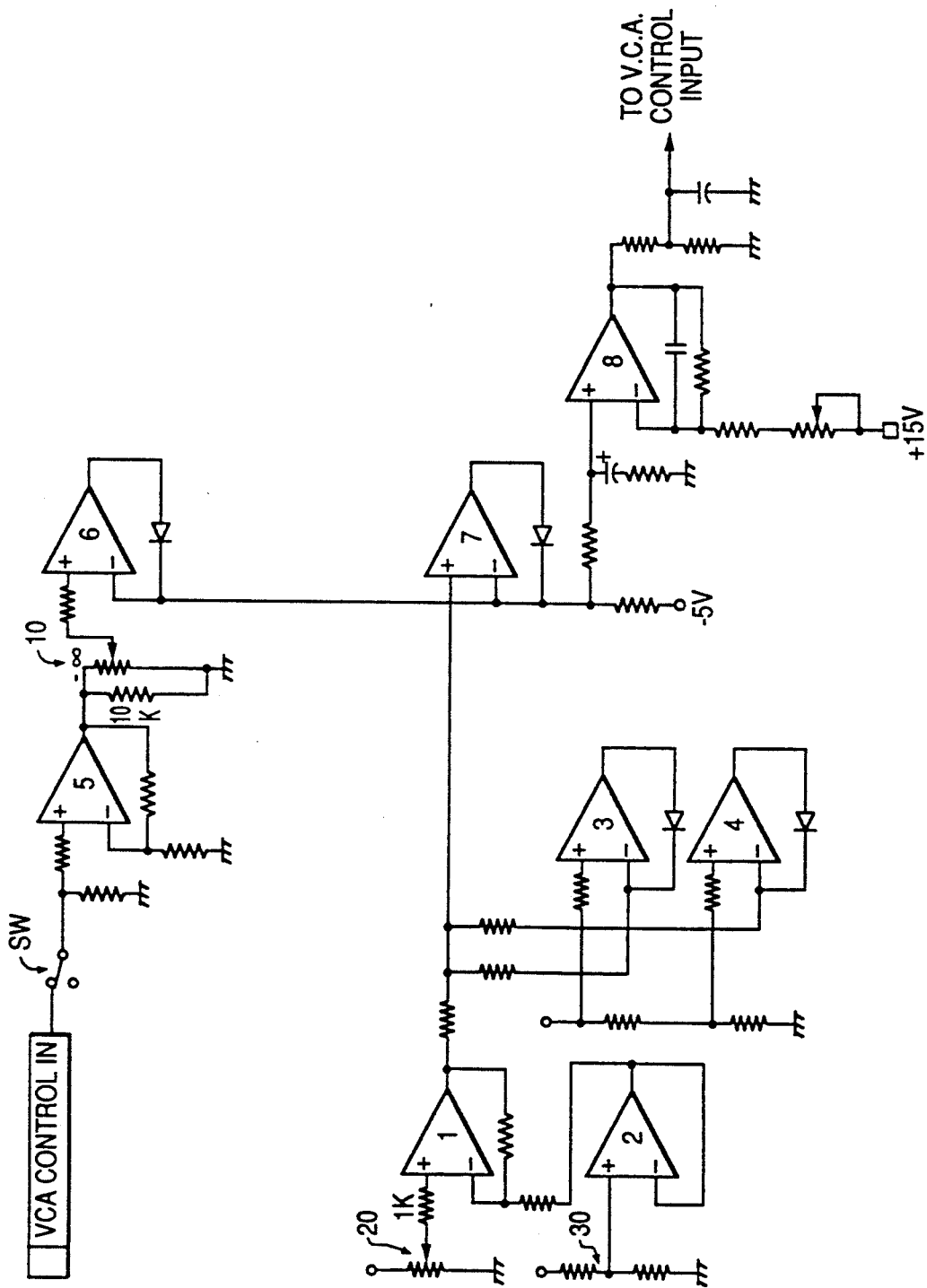
FIG. 5 is a circuit diagram illustrating a circuit which can be used with a preferred embodiment of the present invention.

FIG. 5 illustrates a circuit according to a preferred embodiment for implementing the invention described above.

Figure 1:
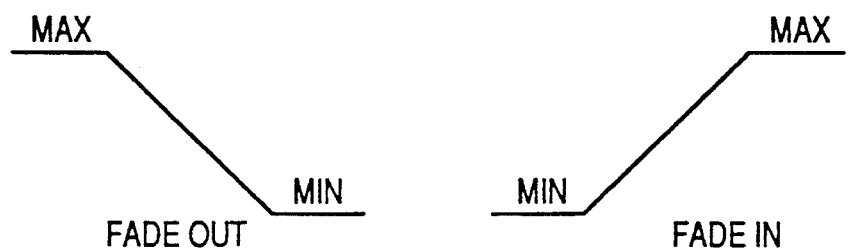
FIG. 1 illustrates the general shape of FADE OUT and FADE IN signals which may be issued from an editor to a mixer.
Figure 2:
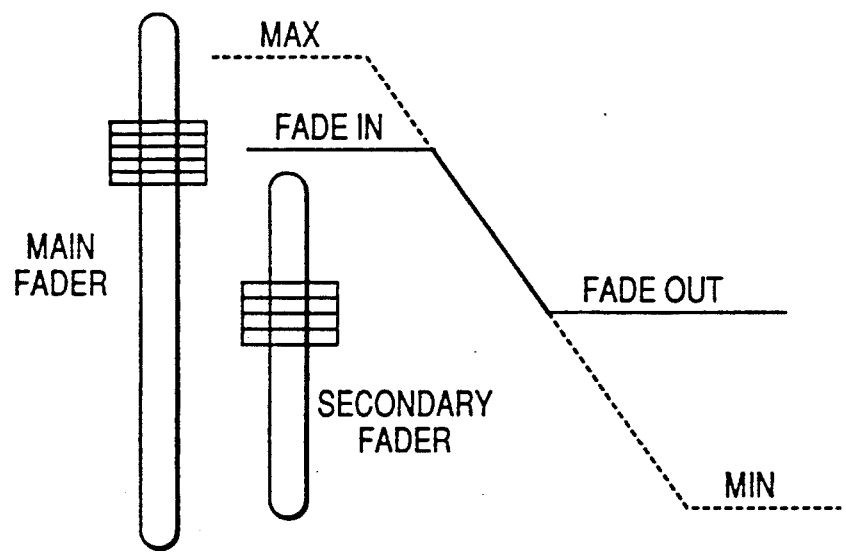
FIG. 2 is a depiction of the operation of a prior art type mixer having main and secondary faders.

In FIG. 5, there is shown circuitry, which may be associated with one channel of a multi-channel mixer, to achieve the novel results described above. In practice, several such circuits would be provided, one for each channel, as desired. As shown, a VCA control voltage is applied through a switch SW which can be in at least a first or second position. As shown, the switch SW is in a position corresponding to a channel activation position such that VCA control voltages may be supplied through the switch to IC 5. IC 5 is a buffer for the VCA control signal. In another position, the channel is deactivated such that no control voltages may be supplied to this channel. The VCA control signal may be a signal corresponding substantially to the signals shown in FIG. 1, for example. The VCA control signal is preferably supplied from the video editor via the mixer's editor interface and the switch SW. This signal is preferably a 0–5 volt DC level. According to one embodiment, the 5 volt signal represents maximum attenuation or a minimum signal level and 0 volts represents no attenuation or a maximum signal level.

Of course it is to be understood that other types of signals and voltage level schemes may be used with this arrangement.

The output of IC 5 is provided to a depth of fade control portion 10. This depth of fade control supplies the VCA control signal to the non-inverting input of IC 6. Depth of fade control 10 is illustrated as a variable resistance voltage divider which may be used to control the amount of attenuation of the VCA control signal. For example, in the position indicated as "−∞" the VCA control signal from the editor (not shown) is sent to the IC 6 unattenuated. In other positions, the depth of fade control 10 provides varying amounts of attenuation up to a maximum attenuation at the position indicated as MAX. At an intermediate position, located between −∞ and MAX, the depth of fade control may attenuate the signal by a factor of 2, for example. For example, assume that the VCA control signal from the editor has a 5 volt FADE OUT level. Then the attenuation would cause the 5 volt FADE OUT level to be adjusted to a new FADE OUT level which according to this example may be 2.5 volts. This may represent a 50 dB higher fade out level than the original fade out level given a circuit sensitivity of 20 dB/V. This depth of fade control 10 corresponds to the secondary fader shown in FIGS. 4A and 4B, for example.

Element 30 functions in a known manner as a reference voltage generator. The main fader is shown as element 20 in FIG. 5. Collectively, ICs 1, 2, 3 and 4 function as a curve shaping circuit in a well known manner to shape the curve for the channel fader 20. The signal from fader 20, after being subject to the curve shaping circuit, is supplied to IC 7. Both IC 6 and IC 7 ar precision rectifiers which function similar to an analog OR gate. These elements operate to compare the fader signal and the editor signal. The larger of the fader signal and the fader depth signal (by voltage) is passed on to the output. This enables the depth of fade level and the channel fader level to be set separately and independently.

IC 8 is a buffer and voltage adjuster. The output of IC 8 feeds the VCA control input for the channel. This portion of the circuit operates in a known manner. The output of IC 8 is then used as a control signal to provide attenuation to an audio signal associated with the particular channel of interest.

It is noted that in the circuit of FIG. 5, neither the main fader nor the secondary fader are actually located in the audio path. Additionally, when the editor is inactive (i.e., the switch SW is in a position other than as shown in FIG. 5), the depth of fade control has no affect on the fader signal output from IC 8.

The foregoing is a description of the preferred embodiments of the present invention. However, the invention is not limited to the foregoing embodiments. Various alterations and modifications will be readily apparent to one of ordinary skill in the art. The invention is only limited by the claims which are appended hereto.

I claim:

1. An audio mixing apparatus comprising:
   a first fader level control means for adjusting a maximum level of a FADE signal;
   second fader level control means for adjusting a minimum level of said FADE signal, wherein said minimum level is adjusted independently of said maximum level; and
   further comprising editor means associated with said mixing apparatus and wherein said editor means generates said FADE signal which is received by said mixing apparatus and wherein said first fader level control means is operable to adjust the maximum level of said FADE signal received from said editor means; and
   wherein said second fader level control means is operable to adjust the minimum level of said FADE signal received from said editor means independent of the maximum level set by said first level control means.

2. The apparatus of claim 1, wherein said FADE signal is provided to an audio signal path to modify an audio signal on said path.

3. The apparatus of claim 2, wherein said first fader level control means and second fader level control means are not located in said audio signal path.

4. The apparatus of claim 1, wherein said first fader level control means comprises a variable resistance control means.

5. The apparatus of claim 1, wherein said second fader level control means comprises a variable resistance control means.

* * * * *